United States Patent
Hu (12)

(10) Patent No.: US 8,652,912 B2
(45) Date of Patent: Feb. 18, 2014

(54) METHODS OF FABRICATING A TRANSISTOR GATE INCLUDING COBALT SILICIDE

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 546 days.

(21) Appl. No.: 11/636,192

(22) Filed: Dec. 8, 2006

(65) Prior Publication Data

US 2008/0135903 A1 Jun. 12, 2008

(51) Int. Cl.
*H01L 21/336* (2006.01)

(52) U.S. Cl.
USPC ........... 438/300; 438/303; 438/664; 438/682; 257/332; 257/413; 257/755

(58) Field of Classification Search
USPC ......... 257/388, 412, 377, 382, 384, 413, 576, 257/E23.085, 314, 315, 321, 329, 330, 331, 257/332, 905, 906, 907, 908, 71, E21.634, 257/E21.619, E29.156, E29.161, E21.622, 257/755, 757, 406, 754, 397; 438/592, 234, 438/309, 300, 585, 587, 588, 257, 259, 268, 438/269, 287, 301, FOR. 338, FOR. 360, 438/581, 583, 630, 682, 555, 721, 755, 629, 438/639, 595, 664, 649, 651, 655, 305, 303, 438/306, 299, 197

See application file for complete search history.

(56) References Cited

U.S. PATENT DOCUMENTS

| | | | |
|---|---|---|---|
| 5,902,129 A | 5/1999 | Yoshikawa et al. | |
| 6,054,355 A | 4/2000 | Inumiya et al. | |
| 6,060,387 A * | 5/2000 | Shepela et al. | 438/630 |
| 6,235,627 B1 | 5/2001 | Nakajima | |
| 6,388,327 B1 | 5/2002 | Giewont et al. | |
| 6,472,265 B1 * | 10/2002 | Hsieh | 438/241 |
| 6,515,338 B1 | 2/2003 | Inumiya et al. | |
| 6,562,716 B2 | 5/2003 | Hashimoto et al. | |
| 6,570,214 B1 * | 5/2003 | Wu | 257/315 |

(Continued)

FOREIGN PATENT DOCUMENTS

| | | | |
|---|---|---|---|
| JP | 11074219 A | 3/1999 | |
| JP | 11074527 A | 3/1999 | |

(Continued)

OTHER PUBLICATIONS

Chen, L.J., "Metal Silicides: An Integral Part of Microelectronics," Journal of the Minerals, Metals and Materials Society, Sep. 2005, pp. 24-31, vol. 57, No. 9 (11 pages).

(Continued)

*Primary Examiner* — Thanh Y Tran (74) *Attorney, Agent, or Firm* — TraskBritt (57) ABSTRACT

A method for fabricating a transistor gate with a conductive element that includes cobalt silicide includes use of a sacrificial material as a place-holder between sidewall spacers of the transistor gate until after high temperature processes, such as the fabrication of raised source and drain regions, have been completed. In addition, semiconductor devices (e.g., DRAM devices and NAND flash memory devices) with transistor gates that include cobalt silicide in their conductive elements are also disclosed, as are transistors with raised source and drain regions and cobalt silicide in the transistor gates thereof. Intermediate semiconductor device structures that include transistor gates with sacrificial material or a gap between upper portions of sidewall spacers are also disclosed.

62 Claims, 11 Drawing Sheets

(56) References Cited

U.S. PATENT DOCUMENTS

| | | | |
|---|---|---|---|
| 6,664,592 B2 | 12/2003 | Inumiya et al. | |
| 6,713,834 B2 | 3/2004 | Mori et al. | |
| 6,737,716 B1* | 5/2004 | Matsuo et al. | 257/406 |
| 6,806,132 B2 | 10/2004 | Mori et al. | |
| 6,930,361 B2 | 8/2005 | Inaba | |
| 6,995,081 B2* | 2/2006 | Vaartstra | 438/592 |
| 7,061,069 B2 | 6/2006 | Mori et al. | |
| 7,135,401 B2 | 11/2006 | Tran et al. | |
| 7,205,227 B2 | 4/2007 | Tran et al. | |
| 7,400,016 B2 | 7/2008 | Inaba | |
| 7,420,259 B2 | 9/2008 | Mori et al. | |
| 7,498,641 B2* | 3/2009 | Wang et al. | 257/388 |
| 2001/0003056 A1* | 6/2001 | Hashimoto et al. | 438/592 |
| 2002/0093073 A1 | 7/2002 | Mori et al. | |
| 2003/0107088 A1* | 6/2003 | Inumiya et al. | 257/368 |
| 2004/0080020 A1 | 4/2004 | Mori et al. | |
| 2004/0121526 A1 | 6/2004 | Yamamoto | |
| 2004/0169221 A1* | 9/2004 | Ko et al. | 257/330 |
| 2004/0229422 A1 | 11/2004 | Mori et al. | |
| 2004/0232515 A1 | 11/2004 | Mori et al. | |
| 2005/0009265 A1* | 1/2005 | Yoo et al. | 438/231 |
| 2005/0156238 A1* | 7/2005 | Wen et al. | 257/347 |
| 2005/0157549 A1* | 7/2005 | Mokhlesi et al. | 365/185.01 |
| 2005/0199963 A1* | 9/2005 | Aoyama | 257/369 |
| 2005/0250315 A1 | 11/2005 | Tran et al. | |
| 2006/0081930 A1 | 4/2006 | Maegawa et al. | |
| 2006/0160296 A1 | 7/2006 | Tran et al. | |
| 2006/0163637 A1 | 7/2006 | Mori et al. | |
| 2006/0199324 A1* | 9/2006 | Yu et al. | 438/199 |
| 2007/0007571 A1* | 1/2007 | Lindsay et al. | 257/306 |

FOREIGN PATENT DOCUMENTS

| | | | |
|---|---|---|---|
| JP | 2001077323 A | 3/2001 | |
| JP | 2001168059 A | 6/2001 | |
| JP | 2002203919 A | 7/2002 | |
| JP | 2004152973 A | 5/2004 | |
| JP | 2004200550 A | 7/2004 | |
| JP | 2004273556 A | 9/2004 | |
| JP | 2004273559 A | 9/2004 | |
| JP | 2004349471 A | 12/2004 | |
| JP | 2005328079 A | 11/2005 | |
| JP | 2006148064 A | 6/2006 | |
| JP | 2006-310884 A | 11/2006 | |
| JP | 2006319365 A | 11/2006 | |
| JP | 2007536740 T | 12/2007 | |
| TW | 448508 B | 8/2001 | |
| TW | 531795 B | 5/2003 | |
| WO | 2005109491 A1 | 11/2005 | |

OTHER PUBLICATIONS

Froment et. Al, "Nickel vs. Cobalt Silicide Integration for sub-50nm CMOS," European Solid-State Device Research, Sep. 16-18, 2003, ESSDERC '03, 33$^{rd}$ Conference, pp. 215-218 (4 pages).

Litwiller, Dave, "CCD vs. CMOS: Facts and Fiction, Choosing an imager means considering not only the chip, but also its manufacturer and how your application will evolve,", Photonics Spectra, Jan. 2001, pp. 154-158 (4 pages).

Webpage, "Silicides," http://www.processmaterials.com/silicides.html, 2005, Process Materials Inc. (2 pages).

Webpage, "CMOS," http://www.en.wikipedia.org/wiki/Cmos, Oct. 18, 2006, Wikipedia Encyclopedia (4 pages).

Invitation to Pay Additional Fees, Form PCT/ISA/206, dated Apr. 2, 2008, in PCT International Application.No. PCT/US2007/086487 (5 pages).

Jong-Uk Bae, et al., "Formation of CoSi2 on Various Polycrystalline Silicon Structures and Its Effects on Thermal Stability," Journal of The Electromechanical Society, vol. 147, No. 4, Apr. 2000, pp. 1551-1554.

International Search Report dated Jul. 16, 2008, for International Application No. PCT/US2007/086487 (6 pages).

Merriam-Webster Dictionary, Definition of "amorphous" accessed Nov. 15, 2010, from www.merriam-webster.com.

Taiwan Search Report completed Jul. 21, 2012, for Taiwan Application No. 096146873, 1 page.

* cited by examiner

METHODS OF FABRICATING A TRANSISTOR GATE INCLUDING COBALT SILICIDE

FIELD OF THE INVENTION

The present invention, in various embodiments, relates generally to methods for fabricating gates of transistors and, more specifically, to methods for fabricating gates that include conductive elements that comprise cobalt silicide, and associated structures. In particular, embodiments of the present invention relate to methods and associated structures in which high temperature processes, such as the fabrication of raised source and drain regions of a transistor, are completed before cobalt silicide features are fabricated.

BACKGROUND OF THE INVENTION

Transistor gates are used in a variety of different types of semiconductor devices. A number of different types of conductive materials have been used to form the elements, or lines, of transistor gates. Tungsten silicide is an example of such a conductive material, and is widely used in semiconductor devices that employ current state-of-the-art technologies.

As feature dimensions of semiconductor device structures decrease, limitations on the materials that are used therein become ever more apparent. For example, at line widths of about 55 nm and less, the bulk electrical resistance of tungsten silicide ($WSi_x$) increases to about $175\mu\Omega$ to about $250\mu\Omega$. Bulk electrical resistances of this magnitude are undesirable, as they decrease the rate at which conductive lines transmit electrical signals and may cause the conductive lines and other elements of a semiconductor device to be heated to temperatures that may adversely affect the performance, structural integrity, and reliability of the semiconductor device.

Cobalt disilicide ($CoSi_2$) has a much lower bulk resistance than tungsten silicide (e.g., about one tenth or less of the bulk resistance of tungsten silicide), but does not retain its quality when exposed to high temperatures, as are encountered during many semiconductor device fabrication processes. For example, the epitaxial processes that are required to form "raised" (i.e., at the same elevation or a higher elevation than a gate oxide) source and drain regions adjacent to transistor gates of some types of transistors, such as those of dynamic random access memory (DRAM) devices and NAND flash memory devices, require temperatures of 900° C. or more. As a consequence of the relatively low thermal stability of cobalt disilicide, it could not be used in transistors with raised source and drain regions or other structures in which conductive elements have conventionally been fabricated before all high temperature processes have been completed.

Accordingly, there is a need for processes that facilitate the use of lower bulk resistance conductive materials in the fabrication of conductive features of semiconductor devices with ever-decreasing feature dimensions, as well as for semiconductor device structures with conductive features that are formed with low bulk resistance materials.

BRIEF DESCRIPTION OF THE DRAWINGS

In the drawings, which depict various features of different aspects of the present invention:

FIGS. 1 through 24 depict an embodiment of a process for fabricating a transistor of a semiconductor device structure, in which a gate of the transistor includes a conductive element formed at least partially from cobalt silicide, in which

DETAILED DESCRIPTION

In one embodiment, the present invention includes methods for fabricating transistor gates, or "word lines," for semiconductor devices. Such a method includes the use of a sacrificial material as a place-holder until high temperature processes have been completed. As a specific but non-limiting example, the sacrificial material may act as a place-holder between sidewall spacers of a transistor gate until after high temperature epitaxial deposition processes are used to form raised source and drain regions adjacent to opposite sides of the transistor gate. Once high temperature processes have been performed, the sacrificial material may be removed and replaced with cobalt silicide.

According to another embodiment, the present invention includes structures that include cobalt silicide conductive features. One nonlimiting example of such a structure is a transistor of a semiconductor device, such as a DRAM device, a NAND flash memory device, as well as any other transistor that includes raised source and drain regions, and semiconductor devices including such structures.

Embodiments of intermediate semiconductor device structures that include transistor gate structures with sacrificial material or a gap between upper portions of sidewall spacers thereof are also within the scope of the present invention.

Other features and advantages of the present invention will become apparent to those in the art through consideration of the ensuing description, the accompanying drawings, and the appended claims.

One embodiment of a method for fabricating a transistor gate with a conductive element that includes cobalt silicide is shown in FIGS. 1 through 24.

Figure 1:
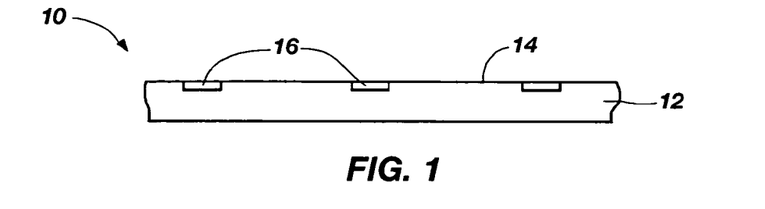
FIG. 1 illustrates a section of a semiconductor device structure under fabrication.

In FIG. 1, a semiconductor device structure 10, including a semiconductor substrate 12 with an active surface 14 and isolation structures 16 (e.g., shallow trench isolation (STI) structures, etc.) formed or fabricated (by any suitable manner known in the art) on or in active surface 14 is depicted.

Figure 2:
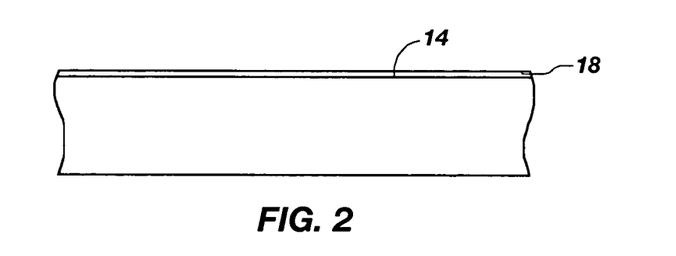
FIGS. 2 through 5 show an enlarged, smaller section of a semiconductor device structure under fabrication.
Figure 3:
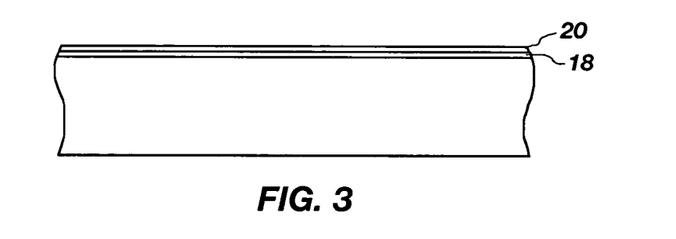

A gate oxide 18 is formed over active surface 14 by known processes, as shown in FIG. 2. As shown in FIG. 3, a polysilicon layer 20 is then deposited over gate oxide 18 and active surface 14 by any known process (e.g., chemical vapor deposition (CVD), etc.).

Figure 4:
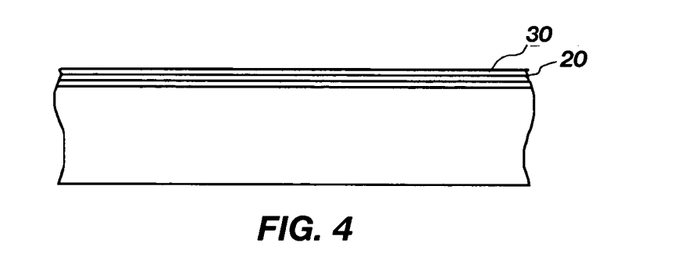

Thereafter, as illustrated in FIG. 4, a layer 30 of tantalum silicide ($TaSi_2$) is formed on or over polysilicon layer 20. Tantalum silicide layer 30 may be formed by any suitable process known in the art, including, but not limited to, a physical vapor deposition (PVD) process (e.g., sputtering). Without limiting the scope of the present invention, tantalum silicide layer 30 may be formed to a thickness of about 200 Å to about 300 Å.

Figure 5:
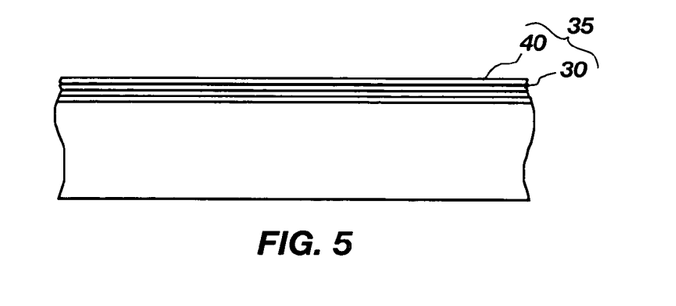

A silicon layer 40 is then formed on or over tantalum silicide layer 30, as depicted in FIG. 5. Silicon layer 40, which may comprise amorphous silicon, or "α-Si," may be formed by any appropriate, known process (e.g., PVD). By way of non-limiting example, silicon layer 40 may have a thickness of about 300 Å to about 600 Å.

Figure 6:
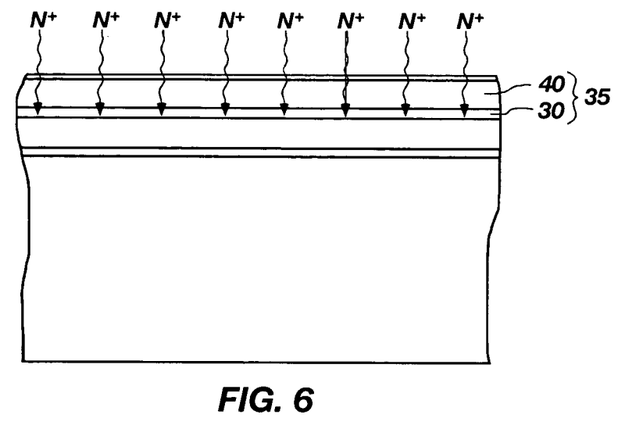
FIGS. 6 through 24 depict an even more enlarged, smaller section of a semiconductor device structure under fabrication.

Once the "stack" 35 of tantalum silicide layer 30 and silicon layer 40 has been formed, nitrogen may be implanted through silicon layer 40 and into tantalum silicide layer 30, as illustrated in FIG. 6. Such implantation may be effected by known processes, such as by way of a $N_{14}^+$ implantation process is effected at a density of $5 \times 10^{15}$ (or 5E15) particles per/cm² at 15 KeV (i.e., a $N_{14}^+$5 E15 15 KeV implantation process is effected).

Figure 7:
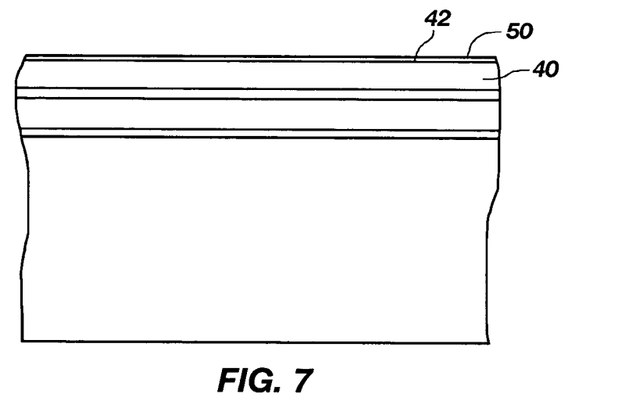

As FIG. 7 shows, once nitrogen implantation is complete, a thin oxide layer 50 may be formed on an exposed surface 42 of silicon layer 40. As an example, and not to limit the scope of the present invention, thin oxide layer 50 may have a thickness of about 30 Å. Any known process (e.g., high temperature oxidation (HTO), in-situ steam-generated (ISSG) oxide, etc.) may be used to form (e.g., grow, deposit, etc.) thin oxide layer 50 onto exposed surface 42 of silicon layer 40.

Figure 8:
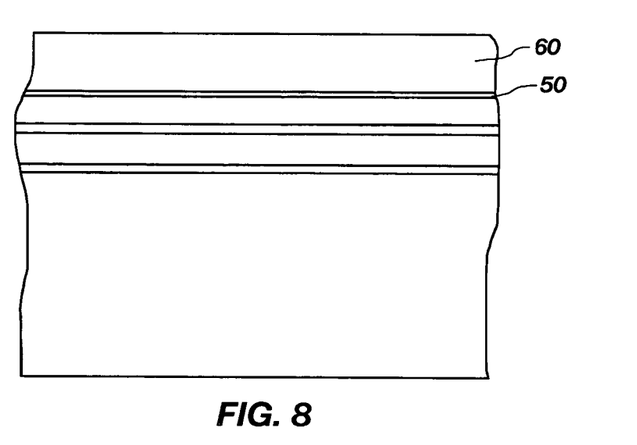

As depicted in FIG. 8, a "sacrificial layer 60" may be formed on or over oxide layer 50. Sacrificial layer 60 may comprise n-doped polysilicon, silicon nitride, or any other suitable material, and may be formed by suitable, known processes (e.g., CVD, etc.). Sacrificial layer 60 may have a thickness of about 1,000 Å.

Figure 9:
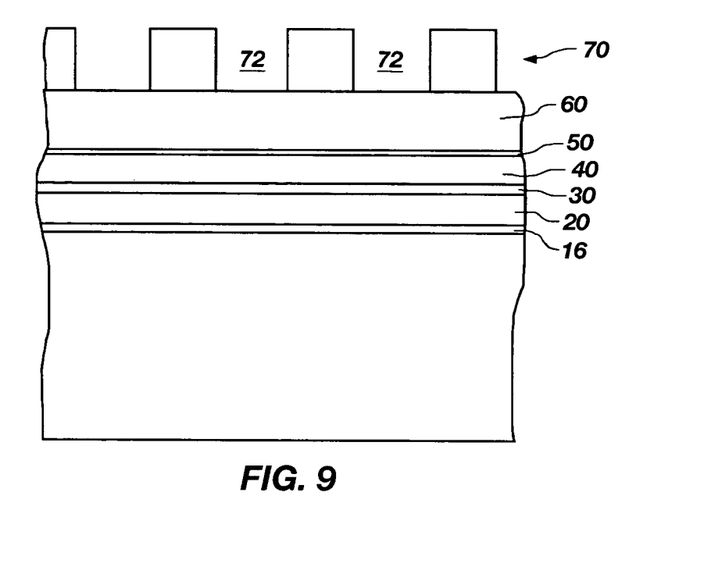
Figure 10:
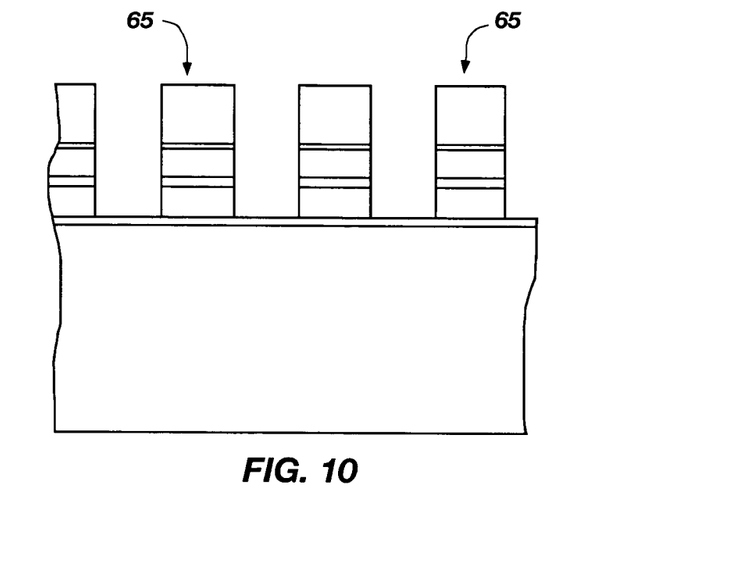

Individual gate stacks 65 may then be formed, as shown in FIGS. 9 and 10. In forming individual gate stacks 65, portions of sacrificial layer 60, oxide layer 50, silicon layer 40, silicide layer 30, and polysilicon layer 20 are removed by known processes. As an example, a mask 70 (e.g., a carbon-based (e.g., transparent carbon) mask, a hard mask, a photomask, etc.) may be formed on or over sacrificial layer 60 by known processes (see FIG. 9), then serve as a pattern through which material removal is effected. The materials of layers 60, 50, 40, 30, and 20 may be removed, for example, by use of one or more suitable etchants (e.g., dry etchants) under process conditions that provide the desired results (e.g., aspect ratios, sidewall shape and orientation, etc.). Material of layer 60 may be removed through apertures 72 in mask 70, while material of each underlying layer 50, 40, 30, 20 may be removed through apertures 72 of mask 70 and/or through openings that are formed in one or more overlying layers 60, 50, 40, 30 as material is removed from the overlying layers.

Figure 11:
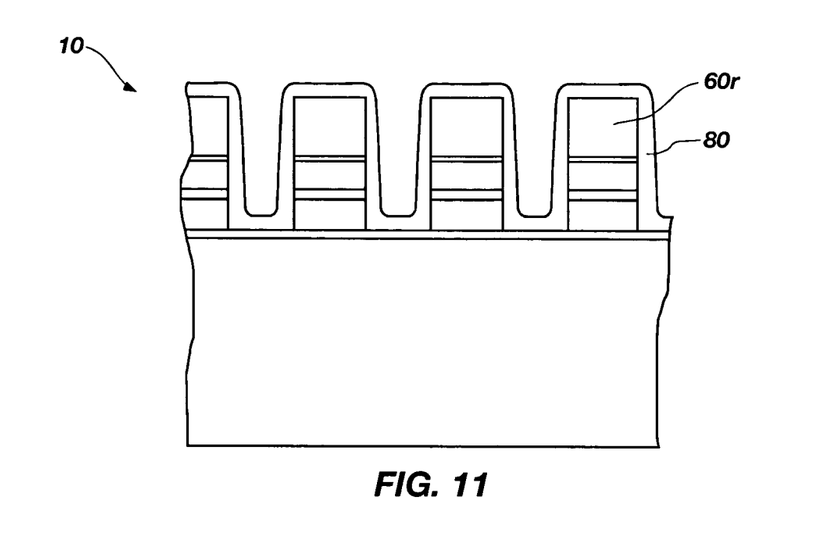
Figure 12:
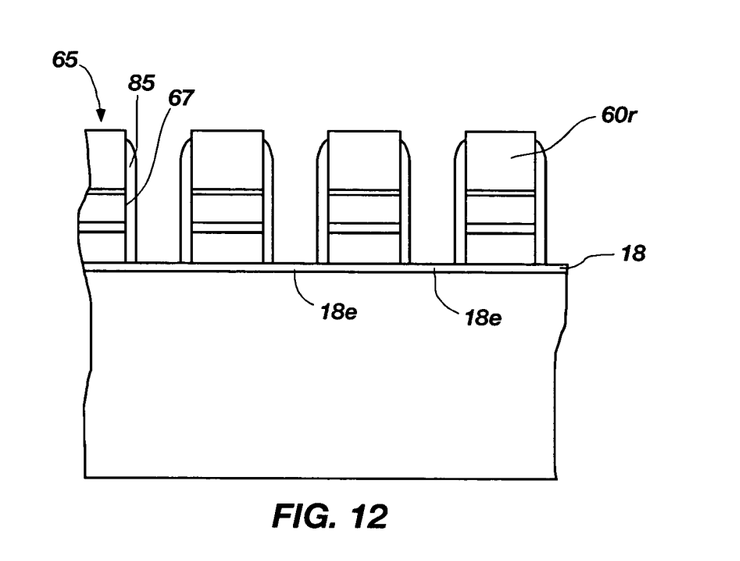

With reference to FIGS. 11 and 12, sidewall spacers 85 are formed on lateral edges 67 of each gate stack 65 by known processes. For example, a layer 80 of a suitable dielectric material, i.e., a material that may be removed selectively with respect to the material of remaining portions 60r of sacrificial layer 60 (FIGS. 8 and 9) (e.g., silicon nitride, silicon oxide, etc., in the case of a polysilicon sacrificial layer 60, a silicon oxide spacer formed by decomposition of tetraethylorthosilicate (TEOS) in the case of a silicon nitride sacrificial layer 60, etc.), may be formed (e.g., blanket deposited) over semiconductor device structure 10, as shown in FIG. 11. Thereafter, as shown in FIG. 12, a spacer etch of a suitable, known type may be effected to define sidewall spacers 85 from portions of layer 80 that are laterally adjacent to lateral edges 67 of gate stacks 65.

Figure 13:
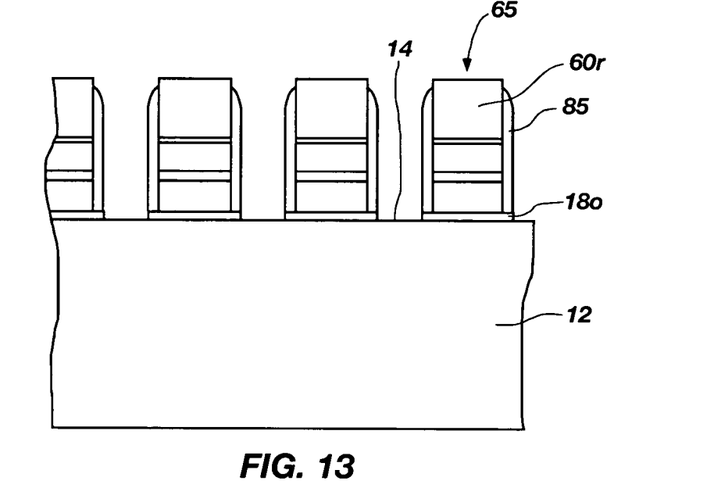

Next, as depicted in FIG. 13, material of gate oxide layer 18 is removed from regions 18e (FIG. 12) of layer 18 that are exposed between adjacent sidewall spacers 85 (FIG. 12) to form individual gate oxide 18o structures. Removal of the material of regions 18e of gate oxide layer 18 may be effected by known processes, such as by use of an etchant that removes the material of gate oxide layer 18 with selectivity over the materials of remaining portions 60r of sacrificial layer 60 (FIGS. 8 and 9) and sidewall spacer 85. Upon removing exposed portions of gate oxide layer 18, portions of active surface 14 of substrate 12 that are located laterally between gate stacks 65 are exposed.

Figure 14:
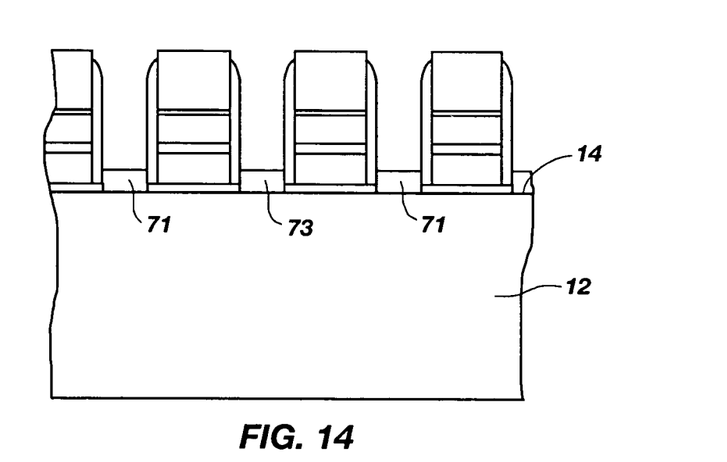

Source and drain regions 71 and 73, respectively, may then be formed on or in the newly exposed regions of active surface 14 of substrate 12, between adjacent gate stacks 65, as FIG. 14 illustrates. The formation of source and drain regions 71 and 73 may be effected by known processes, including, without limitation, deposition, masking, and etching processes to remove silicon from undesired locations. Without limiting the scope of the present invention, known epitaxial processes may be used to form source and drain regions 71 and 73 that protrude from, or are raised relative to, active surface 14 of substrate 12.

Figure 15:
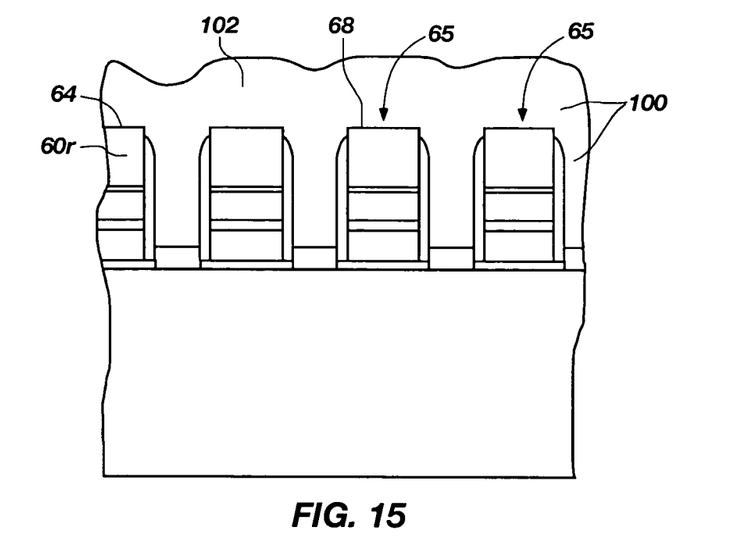

A dielectric layer 100 may then be formed to fill the spaces between adjacent gate stacks 65, as shown in FIG. 15. Dielectric layer 100, which may comprise a doped silicon dioxide, or glass (e.g., borophosphosilicate glass (BPSG), phosphosilicate glass (PSG), borosilicate glass (BSG), etc.), may be formed by known processes (e.g., CVD, spin-on glass, etc.).

Figure 16:
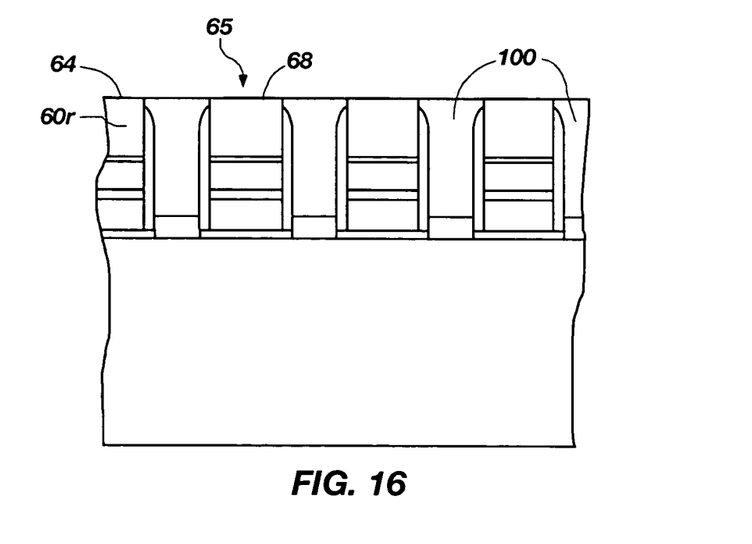

Regions 102 of the resulting dielectric layer 100 that have elevations that exceed the uppermost surfaces 68 of gate stacks 65 (e.g., a top surface 64 of remaining portions 60r of sacrificial layer 60) may be removed, as depicted in FIG. 16. Removal of the material of regions 102 may be carried out by known processes. An example of such a process is chemical-mechanical polishing (CMP). The CMP process may be configured to remove the material of dielectric layer 100 at a faster rate than an exposed material of gate stacks 65 (e.g., the polysilicon of remaining portions 60r of sacrificial layer 60 (FIGS. 8 and 9)) is removed, or "with selectivity over" the exposed material of gate stacks 65. For example, a so-called "stop-on-silicon" (SOS) polishing process may be used.

If any silicon from the epitaxial deposition process is present on top surfaces 64 of remaining portions 60r of sacrificial layer 60, it may be removed by any known, suitable process, such as a wet etch (e.g., that is timed to remove about 300 Å of material).

Figure 17:
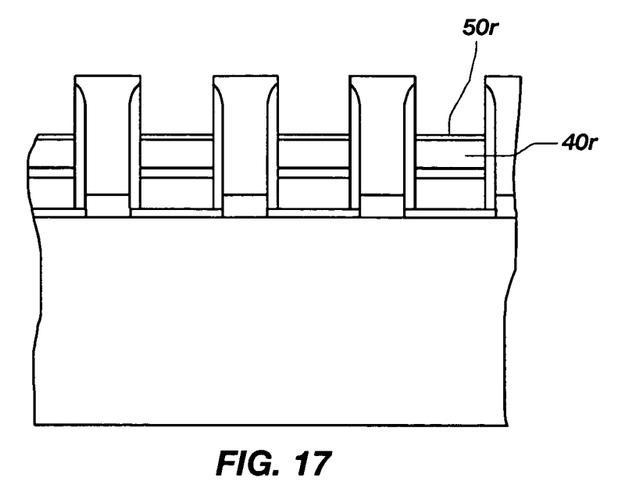

Once remaining portions 60r of sacrificial layer 60 (FIGS. 8 and 9) are exposed through dielectric layer 100 and any silicon present on upper surfaces 64 of remaining portions 60r, remaining portions 60r of sacrificial layer 60 may be removed, as shown in FIG. 17. Remaining portions 60r (FIG. 16) may be removed by known processes. By way of non-limiting example, remaining portions 60r may be removed by use of an etchant (e.g., tetramethylammonium hydroxide (TMAH), a dry process for removing polysilicon, etc.) that removes the material of sacrificial layer 60 (e.g., polysilicon) with selectivity over the materials of dielectric layer 100 and sidewall spacers. Alternatively, the remaining portions 60r may be removed through a mask (not shown).

Figure 18:
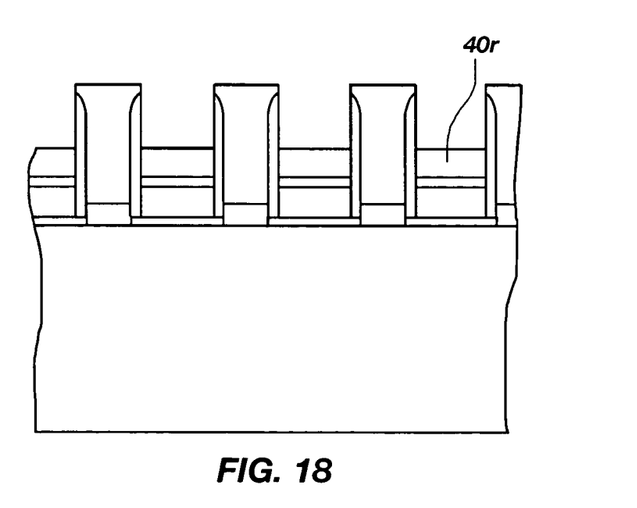

Remaining portions 50r of thin oxide layer 50 (see FIGS. 8 and 9) may also be removed, as shown in FIG. 18. Removal of remaining portions 50r may be effected by any suitable, known process, and with selectivity over the N-implanted α-Si of remaining portions 40r of silicon layer 40 (see FIGS. 8 and 9).

Figure 19:
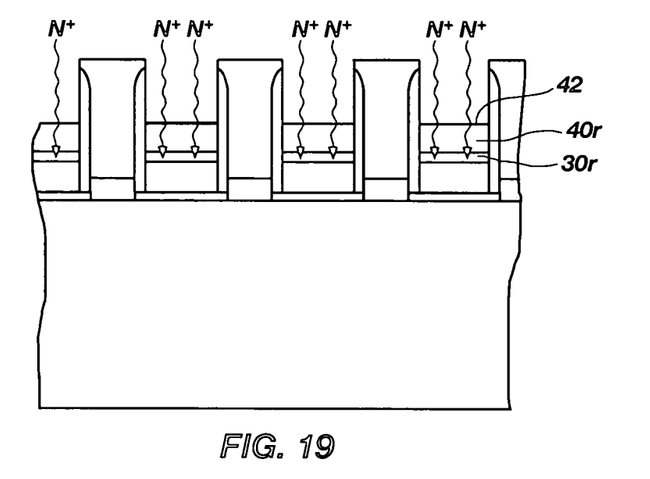

Thereafter, as illustrated in FIG. 19, remaining portions 30r of tantalum silicide layer 30 (see FIGS. 8 and 9) may again be subjected to nitrogen implant processes through the newly exposed remaining portions 40r of silicon layer 40 (see FIGS. 8 and 9). Without limiting the scope of the present invention, a known $N_{14}{}^+5E15$ 15 KeV implantation process may be employed. Such implantation may be useful for improving the barrier properties of remaining portions 30r of tantalum silicide layer 30 (FIGS. 8 and 9).

At this point in the process flow, any native oxide that has been formed on the exposed surfaces 42 of remaining portions 40r of silicon layer 40 (see FIGS. 8 and 9) may be removed by any suitable preclean process (e.g., use of a wet etchant).

Figure 20:
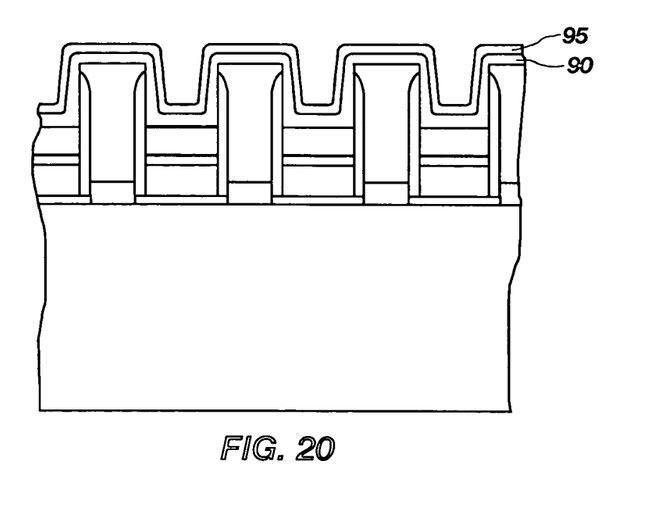

FIG. 20 shows the subsequent, successive deposition of a cobalt layer 90 and a titanium or titanium nitride layer 95. Known processes (e.g., chemical vapor deposition (CVD), atomic layer deposition (ALD), physical vapor deposition (PVD) (e.g., sputtering), etc.) may be used to form cobalt layer 90 and titanium layer 95. When low pressure sputtering (ALPS) processes are used to form cobalt layer 90, cobalt layer 90 may have good step coverage (e.g., about 80% bottom step coverage on the largest critical dimensions (CD) of the transistor gate to about 60% bottom step coverage on the smallest CD of the transistor gate). Titanium or titanium nitride layer 95 prevents oxidation of cobalt layer 90 during subsequent processing.

Figure 21:
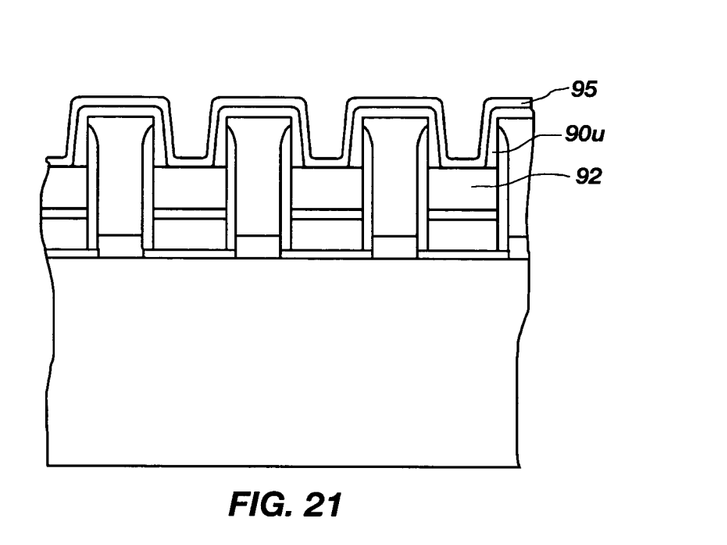

After cobalt layer 90 and titanium or titanium nitride layer 95 have been formed, suitable, known rapid thermal processing (RTP) techniques, may be used to anneal portions of cobalt layer 90 to adjacent, contacted remaining portions 40r of silicon layer 40 (see FIGS. 8 and 9), as depicted in FIG. 21. Without limiting the scope of the present invention such RTP, which may also be referred to as a "first RTP" or as a "first anneal," may be effected at a temperature of about 450° C. to about 550° C. for a duration of about thirty seconds in a nitrogen ($N_2$) environment. The result of the RTP is cobalt monosilicide (CoSi) 92, which is also referred to herein as "cobalt silicide."

Figure 22:
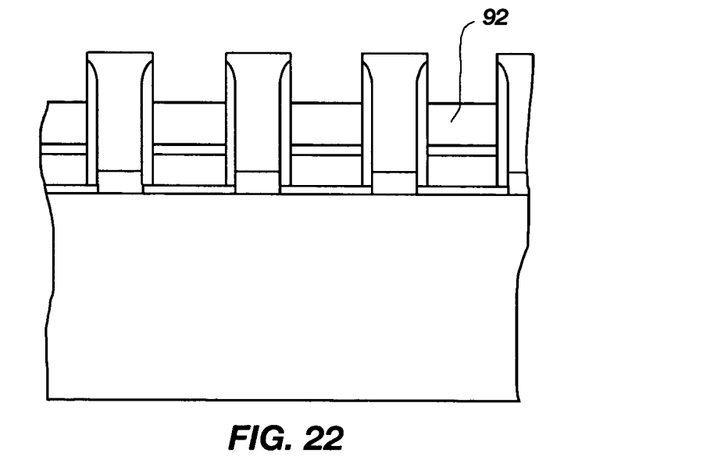

Once annealing has taken place, titanium layer 95 and unreacted regions 90u of cobalt layer 90 (see FIG. 21) may be removed, or "stripped," as shown in FIG. 22. Known removal processes (e.g., etching processes, etc.) may be used. As a nonlimiting example, titanium layer 95 and unreacted regions 90u of cobalt layer 90 may be removed in a so-called "piranha" environment (e.g., at a temperature of about 90° C. for a duration of about 90 seconds), with hot sulfuric acid (e.g., at a temperature of about 90° C. to about 100° C. for a duration of about 90 seconds), or with any other suitable etchants, strippers, or solvents. The process that is used to remove unreacted regions 90u may have selectivity for cobalt over cobalt silicide.

After titanium layer 95 and unreacted regions 90u of cobalt layer 90 (see FIG. 21) have been removed, further RTP may be performed on the cobalt monosilicide 92. Such RTP may also be referred to as a "second RTP" or as a "second anneal." Without limiting the scope of the present invention, this RTP may include exposing cobalt monosilicide 92 to a temperature of about 750° C. to about 850° C. in a nitrogen ($N_2$) environment for a duration of about thirty seconds. The result is cobalt disilicide ($CoSi_2$) or, simply "cobalt silicide."

Figure 23:
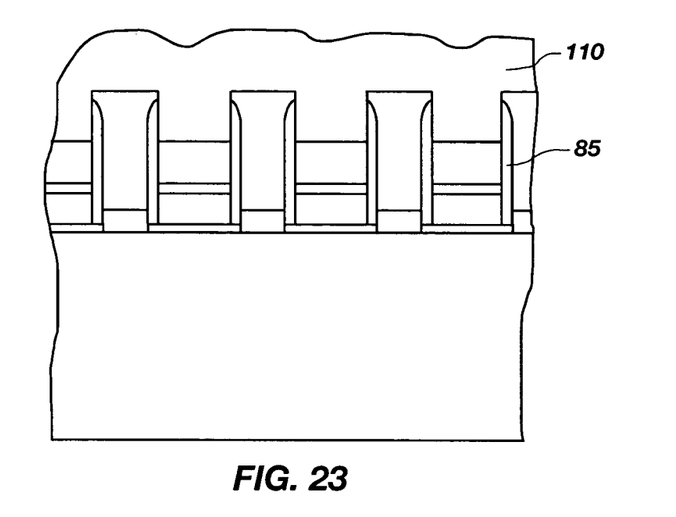
Figure 24:
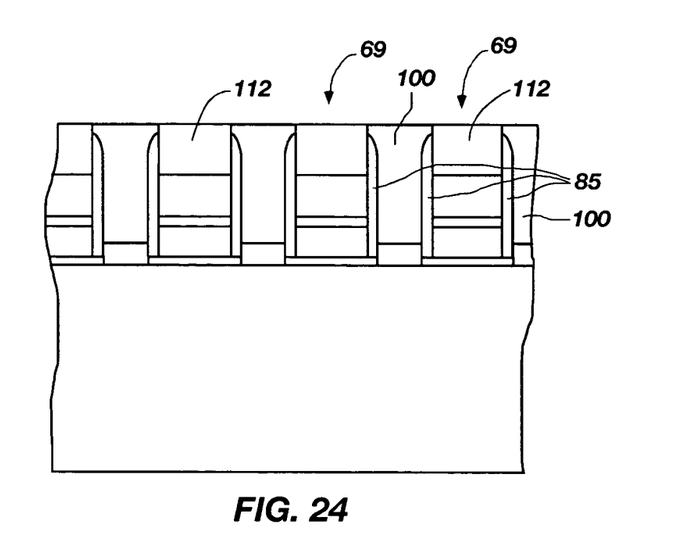

As depicted in FIGS. 23 and 24, transistor gate caps 112 may be formed by blanket depositing a layer 110 of a suitable dielectric material (e.g., silicon nitride when sidewall spacers 85 are formed from silicon nitride, any suitable interlayer dielectric (ILD) material, glass (e.g., BPSG), or the like when sidewall spacers 85 comprise silicon dioxide, etc.), then removing (e.g., by CMP, wet etch processes, etc.) regions of layer 110 that are not located between sidewall spacers 85.

Figure 25:
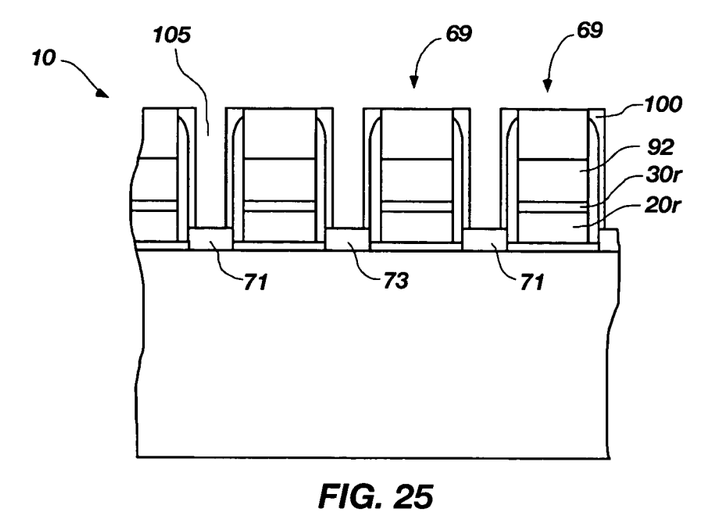
FIG. 25 illustrates an embodiment of a semiconductor device structure that includes a transistor with a gate including a conductive element that is partially formed from cobalt silicide.

Remaining regions of dielectric layer 100, or merely portions thereof, as shown in FIG. 25, may then be removed from between sidewall spacers 85 of adjacent transistor gates 69 to form contact holes 105 that expose source and drain regions 71 and 73. Further processing of semiconductor device structure 10, including, but not limited to, the formation of contact plugs (not shown) (e.g., polysilicon plugs, tungsten plugs, etc.) over source and drain regions 71 and 73, may then be conducted in any suitable manner known in the art to fabricate complete semiconductor devices.

With continued reference to FIG. 25, a transistor gate 69 that results from the processes described herein may include a conductive element with a polysilicon layer 20r, an about 200 Å to about 300 Å thick tantalum silicide layer 30r, and an about 300 Å to about 600 Å thick cobalt silicide layer 92. As shown, a contact hole 105 may be formed (e.g., by suitable mask and etch processes) between adjacent transistor gates 69 to expose a source or drain region 71, 73 located laterally between adjacent transistor gates 69.

Figure 26:
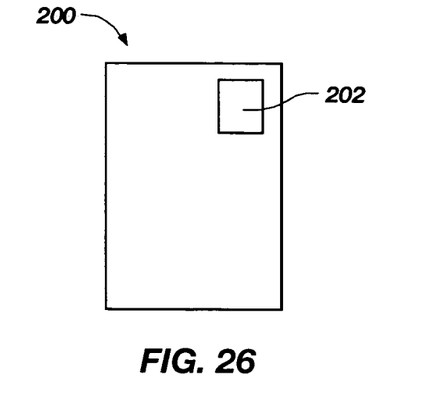
FIG. 26 is a schematic representation of an embodiment of an electronic device that includes a semiconductor device with one or more transistors that include transistor gates that include conductive elements with cobalt silicide.

Turning now to FIG. 26, an electronic device 200 that includes a semiconductor device 202 with a transistor gate with a conductive element that comprises cobalt silicide is shown. The semiconductor device 202 may comprise a memory device, such as a DRAM device or a NAND flash memory device. Examples of electronic devices 200 that include NAND flash memory include, but are not limited to, portable digital music players (e.g., MP3, IPOD®, etc.), universal serial bus (USB) drives, removal storage cards, cellular telephones, cameras, and other electronic devices in which it is desirable to retain memory without power.

Although the foregoing description contains many specifics, these should not be construed as limiting the scope of the present invention, but merely as providing illustrations of some of the presently preferred embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein that fall within the meaning and scope of the claims are to be embraced thereby.

What is claimed:

1. A method for fabricating a transistor gate of a memory device, comprising:

forming source and drain regions on top of a planar active surface of a substrate, the source and drain regions protruding from the planar active surface and from a gate oxide on the planar active surface;

forming a dielectric material on and in contact with the source and drain regions protruding from the planar active surface of the substrate; and exposing to cobalt a region of silicon to fabricate from cobalt silicide at least a portion of a conductive element within a transistor gate, the region of silicon disposed between the source and drain regions and recessed relative to the dielectric material, the dielectric material isolating the source and drain regions from all silicide material including the cobalt silicide.

2. The method of claim 1, further comprising:
forming a pair of sidewall spacers of the transistor gate; and
forming a cap over the at least a portion of the conductive element,
wherein forming source and drain regions comprises forming a source region and a drain region adjacent to the sidewall spacers of the transistor gate, the source region and the drain region protruding from the planar active surface of the substrate on which the transistor gate is formed, the source region and the drain region initiating on an uppermost surface of the planar active surface of the substrate; and wherein exposing to cobalt a region of silicon comprises:
after forming the source and drain regions, introducing the cobalt to the region of silicon between the pair of sidewall spacers; and
annealing the cobalt and the silicon of the region of silicon.

3. The method of claim 2, wherein the act of annealing is effected with the cap in place over the at least the portion of the conductive element.

4. The method of claim 3, further comprising:
after the act of annealing, removing the cap.

5. The method of claim 4, further comprising:
additionally annealing the cobalt and the silicon of the region of silicon to form cobalt disilicide.

6. The method of claim 5, wherein additionally annealing is effected after removing the cap.

7. A method for fabricating a transistor gate of a memory device, comprising:
forming source and drain regions on top of a planar active surface of a substrate;
forming a dielectric material on the source and drain regions; and
fabricating from cobalt silicide at least a portion of a conductive element within a transistor gate disposed between the source and drain regions, the act of fabricating comprising:
while the dielectric material is on the source and drain regions, removing a sacrificial material from between sidewall spacers of the transistor gate to expose amorphous silicon overlying a silicide layer and disposed between the sidewall spacers; and
forming the cobalt silicide between the sidewall spacers.

8. A method for fabricating a transistor gate, comprising:
forming a gate oxide upon a planar active surface of a semiconductor substrate;
forming at least one conductive material over the gate oxide;
forming silicon over the at least one conductive material;
forming a sacrificial material over the at least one conductive material;
removing portions of the sacrificial material, the silicon, and the at least one conductive material to form at least one gate stack comprising a remaining portion of the sacrificial material, a remaining portion of the silicon, and a remaining portion of the at least one conductive material;
forming sidewall spacers on lateral edges of the at least one gate stack;
forming active-device regions adjacent to the sidewall spacers on each side of the at least one gate stack, the active-device regions raised relative to the planar active surface of the semiconductor substrate and protruding from the gate oxide;
forming a dielectric material on and in contact with the active-device regions raised relative to the planar active surface of the semiconductor substrate;
planarizing the dielectric material to expose the remaining portion of the sacrificial material;
removing the remaining portion of the sacrificial material to expose the remaining portion of the silicon, the remaining portion of the silicon disposed between the active-device regions and recessed relative to the dielectric material;
exposing to cobalt the remaining portion of the silicon to fabricate cobalt silicide within the at least one gate stack between the sidewall spacers, the dielectric material isolating the active-device regions from all silicide material including the cobalt silicide; and
forming a gate cap over the cobalt silicide.

9. A method for fabricating a transistor gate of a memory device, comprising:
forming a dielectric material in contact with source and drain regions on a substrate; and
exposing to cobalt a region of silicon to fabricate from cobalt silicide at least a portion of a conductive element within a transistor gate, the region of silicon disposed between the source and drain regions and recessed relative to the dielectric material in contact with the source and drain regions, the dielectric material isolating the source and drain regions from all silicide material including the cobalt silicide.

10. The method of claim 9, wherein the act of exposing is effected following all processes in which process temperatures of about 900° C. or greater are employed.

11. The method of claim 9, wherein the act of exposing comprises:
removing a sacrificial material from between sidewall spacers of the transistor gate to expose the region of silicon; and
contacting the region of silicon with the cobalt to form the cobalt silicide between the sidewall spacers.

12. The method of claim 9, comprising a method for fabricating a transistor gate of a dynamic random access memory device.

13. The method of claim 9, comprising a method for fabricating a transistor gate of a NAND flash memory device.

14. A method for fabricating a transistor gate of a memory device, comprising:
forming a dielectric material on source and drain regions on a substrate; and
fabricating from cobalt silicide at least a portion of a conductive element within a transistor gate disposed between the source and drain regions, the act of fabricating comprising:
while the dielectric material is on the source and drain regions, removing a sacrificial material from between sidewall spacers of the transistor gate to expose amorphous silicon overlying a silicide layer and disposed between the sidewall spacers; and
forming the cobalt silicide between the sidewall spacers.

15. The method of claim 14, wherein forming the cobalt silicide between the sidewall spacers comprises introducing cobalt between the sidewall spacers.

16. The method of claim 15, wherein forming the cobalt silicide between the sidewall spacers further comprises annealing the cobalt and the amorphous silicon.

17. The method of claim 16, wherein annealing includes a first anneal in which the cobalt silicide is formed.

18. The method of claim 17, further comprising forming a cap over the cobalt silicide.

19. The method of claim 18, wherein forming the cap comprises forming a cap comprising titanium or titanium nitride over the cobalt silicide.

20. The method of claim 18, wherein the first anneal is effected with the cap in place.

21. The method of claim 20, further comprising removing the cap following the first anneal.

22. The method of claim 21, further comprising additionally annealing the cobalt silicide in a second anneal to form cobalt disilicide.

23. The method of claim 22, wherein the second anneal is effected after removing the cap.

24. The method of claim 17, wherein annealing also includes a second anneal in which cobalt disilicide is formed.

25. A method for fabricating a transistor gate, comprising:
forming at least one conductive material over a gate oxide upon a semiconductor substrate;
forming silicon over the at least one conductive material;
forming a sacrificial material over the at least one conductive material;
removing portions of the sacrificial material, the silicon, and the at least one conductive material to form at least one gate stack;
forming sidewall spacers on lateral edges of the at least one gate stack;
forming active-device regions adjacent to the sidewall spacers on each side of the at least one gate stack;
forming a dielectric material over and in contact with the active-device regions;
planarizing the dielectric material to expose remaining portions of the sacrificial material;
removing the remaining portions of the sacrificial material;
exposing to cobalt a remaining portion of the silicon to fabricate cobalt silicide between the sidewall spacers, the dielectric material isolating the source and drain regions from all silicide material including the cobalt silicide; and
forming a gate cap over the cobalt silicide.

26. The method of claim 25, wherein forming at least one conductive material comprises forming at least one of polysilicon and tantalum silicide over the gate oxide.

27. The method of claim 25, wherein forming at least one conductive material comprises forming polysilicon over the gate oxide and tantalum silicide over the polysilicon.

28. The method of claim 27, further comprising implanting the tantalum silicide with nitrogen species.

29. The method of claim 28, wherein implanting is effected through the silicon.

30. The method of claim 25, wherein forming at least one conductive material comprises forming tantalum silicide with a thickness of about 200 Å to about 300 Å.

31. The method of claim 25, wherein forming silicon comprises forming amorphous silicon.

32. The method of claim 25, wherein forming silicon comprises forming a film comprising the silicon and having a thickness of from about 300 Å to about 600 Å.

33. The method of claim 25,
wherein forming at least one conductive material comprises forming tantalum silicide over the gate oxide;
wherein removing portions of the sacrificial material, the silicon, and the at least one conductive material comprises removing portions of the sacrificial material, the silicon, and the tantalum silicide to form at least one gate stack comprising the remaining portion of the sacrificial material, the remaining portion of the silicon, and a remaining portion of the tantalum silicide; and
further comprising implanting the remaining portion of the tantalum silicide with nitrogen species.

34. The method of claim 33, wherein implanting the remaining portion of the tantalum silicide is effected through the remaining portion of the silicon.

35. The method of claim 25, wherein forming a sacrificial material comprises forming a sacrificial material having a thickness of about 1,000 Å.

36. The method of claim 25, wherein forming a sacrificial material comprises forming polysilicon.

37. The method of claim 25, wherein forming sidewall spacers comprises forming sidewall spacers comprising silicon nitride or silicon dioxide.

38. The method of claim 25, wherein forming a sacrificial material comprises forming silicon nitride.

39. The method of claim 25, wherein forming sidewall spacers comprises forming sidewall spacers comprising silicon dioxide.

40. The method of claim 39, wherein forming sidewall spacers comprising silicon dioxide comprises decomposing tetraethylorthosilicate to deposit the silicon dioxide on sidewalls of the at least one gate stack.

41. The method of claim 25, wherein forming active-device regions comprises epitaxially depositing silicon.

42. The method of claim 25, further comprising:
before forming a sacrificial material, forming a thin oxide material over the silicon.

43. The method of claim 42, wherein forming a thin oxide material comprises forming a thin oxide material having a thickness of about 30 Å.

44. The method of claim 42, further comprising:
after removing the remaining portion of the sacrificial material, removing the thin oxide material.

45. The method of claim 25, wherein
exposing to cobalt the remaining portion of the silicon comprises:
forming the cobalt in contact with the silicon; and
annealing the cobalt and the silicon.

46. The method of claim 45, further comprising:
forming titanium or titanium nitride over the cobalt.

47. The method of claim 46, wherein annealing comprises performing a first anneal with the titanium or titanium nitride in place, the first anneal forming CoSi.

48. The method of claim 47, further comprising:
after performing the first anneal, removing the titanium or titanium nitride.

49. The method of claim 48, further comprising:
after removing the titanium or titanium nitride, performing a second anneal, the second anneal forming $CoSi_2$.

50. A method for fabricating a transistor gate of a memory device, comprising:
forming a pair of sidewall spacers for a transistor gate;
forming a source and drain adjacent to the sidewall spacers of the transistor gate;
forming a dielectric material on and in contact with the source and drain;
fabricating a conductive element within the transistor gate and between the pair of sidewall spacers, comprising:
exposing to cobalt a region of silicon to fabricate cobalt silicide between the pair of sidewall spacers, the region of silicon disposed between the source and the drain and recessed relative to the dielectric material, the dielectric material isolating the source and drain from all silicide material including the cobalt silicide; and
forming a cap over an at least partially fabricated conductive element.

51. The method of claim 50, wherein the act of fabricating a conductive element is effected following all processes in which process temperatures of about 900° C. or greater are employed.

52. The method of claim 50, wherein the act of exposing comprises:
removing a sacrificial material from between the sidewall spacers of the transistor gate; and fabricating the cobalt silicide between the pair of sidewall spacers in an area previously occupied by the sacrificial material.

53. The method of claim 52, wherein removing a sacrificial material comprises exposing the region of silicon between the sidewall spacers.

54. The method of claim 53, wherein fabricating the cobalt silicide between the pair of sidewall spacers comprises introducing the cobalt between the sidewall spacers.

55. The method of claim 54, wherein fabricating the cobalt silicide between the pair of sidewall spacers further comprises annealing the cobalt and the silicon.

56. The method of claim 55, wherein annealing comprises performing a first anneal in which cobalt silicide is formed.

57. The method of claim 56, wherein forming a cap comprises forming a cap comprising titanium or titanium nitride over the at least partially fabricated conductive element.

58. The method of claim 57, wherein the first anneal is effected with the cap in place.

59. The method of claim 58, further comprising, after performing the first anneal, removing the cap.

60. The method of claim 59, further comprising additionally annealing the cobalt and the silicon in a second anneal to form cobalt disilicide.

61. The method of claim 60, wherein the second anneal is effected after removing the cap.

62. The method of claim 56, wherein annealing also comprises performing a second anneal in which cobalt disilicide is formed.

\* \* \* \* \*